United States Patent
Jiang et al.

(10) Patent No.: US 11,101,174 B2
(45) Date of Patent: Aug. 24, 2021

(54) GAP FILL DEPOSITION PROCESS

(71) Applicant: Applied Materials, Inc., Santa Clara, CA (US)

(72) Inventors: Hao Jiang, San Jose, CA (US); Nikolaos Bekiaris, Campbell, CA (US); Erica Chen, Cupertino, CA (US); Mehul B. Naik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/653,601

(22) Filed: Oct. 15, 2019

(65) Prior Publication Data

US 2021/0111067 A1    Apr. 15, 2021

(51) Int. Cl.
| | |
|---|---|
| *H01L 21/00* | (2006.01) |
| *H01L 21/768* | (2006.01) |
| *H01L 21/762* | (2006.01) |
| *H01L 21/285* | (2006.01) |
| *H01L 21/02* | (2006.01) |
| *H01L 21/30* | (2006.01) |
| *H01L 21/324* | (2006.01) |
| *H01L 21/3213* | (2006.01) |

(52) U.S. Cl.
CPC .. *H01L 21/76879* (2013.01); *H01L 21/02301* (2013.01); *H01L 21/28556* (2013.01); *H01L 21/3003* (2013.01); *H01L 21/324* (2013.01); *H01L 21/32136* (2013.01); *H01L 21/76224* (2013.01)

(58) Field of Classification Search
CPC ......... H01L 21/76879; H01L 21/02301; H01L 21/28556; H01L 21/3003; H01L 21/32136; H01L 21/324; H01L 21/76224
See application file for complete search history.

(56) References Cited

U.S. PATENT DOCUMENTS

| | | | |
|---|---|---|---|
| 6,849,122 B1 | 2/2005 | Fair | |
| 7,429,402 B2 | 9/2008 | Gandikota et al. | |
| 7,691,442 B2 | 4/2010 | Gandikota et al. | |
| 7,759,749 B2 * | 7/2010 | Tanikawa | H01L 21/28556 |
| | | | 257/416 |
| 9,190,321 B2 | 11/2015 | Cabral, Jr. et al. | |
| 9,646,850 B2 * | 5/2017 | Pethe | F27B 17/0025 |
| 9,679,810 B1 | 6/2017 | Nag et al. | |
| 9,685,371 B2 * | 6/2017 | Zope | H01L 23/53209 |
| 10,403,729 B2 * | 9/2019 | Lee | H01L 21/76849 |
| 10,410,918 B2 | 9/2019 | Wu et al. | |

(Continued)

OTHER PUBLICATIONS

International Search Report PCT/2020/046396 dated Nov. 26, 2020 consists of 12 pages.

*Primary Examiner* — Nikolay K Yushin
(74) *Attorney, Agent, or Firm* — Patterson + Sheridan, LLP

(57) ABSTRACT

Methods for forming an interconnections structure on a substrate in a cluster processing system and thermal processing such interconnections structure are provided. In one embodiment, a method for a device structure for semiconductor devices includes forming a barrier layer in an opening formed in a material layer disposed on a substrate, forming an interface layer on the barrier layer, forming a gap filling layer on the interface layer, and performing an annealing process on the substrate, wherein the annealing process is performed at a pressure range greater than 5 bar.

19 Claims, 8 Drawing Sheets

(56) References Cited

U.S. PATENT DOCUMENTS

| | | |
|---|---|---|
| 2006/0240187 A1 | 10/2006 | Weidman |
| 2007/0111519 A1 | 5/2007 | Lubomirsky et al. |
| 2009/0029126 A1* | 1/2009 | Tanikawa ............ H01L 21/2885 |
| | | 428/209 |
| 2012/0252207 A1 | 10/2012 | Lei et al. |
| 2012/0309190 A1 | 12/2012 | Kelly et al. |
| 2015/0093891 A1 | 4/2015 | Zope et al. |
| 2015/0203961 A1 | 7/2015 | Ha et al. |
| 2016/0126104 A1 | 5/2016 | Shaviv et al. |
| 2017/0011932 A1* | 1/2017 | Pethe .................. F27B 17/0025 |
| 2017/0287842 A1 | 10/2017 | Fu et al. |
| 2018/0053725 A1 | 2/2018 | Edelstein et al. |
| 2018/0068890 A1 | 3/2018 | Zope et al. |
| 2018/0182856 A1* | 6/2018 | Lee ..................... H01L 23/5226 |
| 2018/0240682 A1 | 8/2018 | Lai et al. |
| 2018/0258533 A1 | 9/2018 | Liang et al. |
| 2018/0342396 A1 | 11/2018 | Wong et al. |
| 2019/0259625 A1* | 8/2019 | Nemani ............ H01L 21/02129 |

\* cited by examiner

GAP FILL DEPOSITION PROCESS

BACKGROUND OF THE DISCLOSURE

Field of the Disclosure

Embodiments of the present disclosure generally relate to methods for forming a metal containing material. More particularly, embodiments of the present disclosure generally relate to methods for forming a metal containing material in a small dimension opening in a device structure for semiconductor devices.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

As the dimensions of the integrated circuit components are reduced (e.g., to deep sub-micron dimensions), the materials used to fabricate such components must be carefully selected in order to obtain satisfactory levels of electrical performance. In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. As the width of trenches continues to shrink, the aspect ratio (depth divided by width) continues to grow for the stacking of the semiconductor chips. One challenge regarding the manufacture of high aspect ratio trenches is avoiding the formation of voids during the deposition of desired materials in the trenches.

To fill a trench, a layer of material layer, such as dielectric layer or metal layer, is deposited. The material layer typically covers the field, as well as the walls and the bottom of the trench. If the trench is wide and shallow, it is relatively easy to completely fill the trench. However, as the trench aspect ratio increases, it becomes more likely that the opening of the trench will "pinch off", forming a void (e.g., defects) within the trench.

To decrease the likelihood of forming a void within the trench or forming seams within the trench, many different process techniques have been developed to fill in the trench with the desired material layer with minimum defects. However, poor process control during the deposition process will result in irregular structure profiles or early closure of the trench, resulting in voids, seems or air gap in the trench while filling the trench with the dielectric materials.

Thus, a need exists for improvements in deposition processes for forming material layers in a trench with desired profiles with minimum defects.

SUMMARY

Methods for forming an interconnections structure on a substrate in a cluster processing system and thermal processing such interconnections structure are provided. In one embodiment, a method for forming a device structure for a semiconductor device includes forming a barrier layer in an opening formed in a material layer disposed on a substrate, forming an interface layer on the barrier layer, forming a gap filling layer on the interface layer, and performing an annealing process on the substrate, wherein the annealing process is performed at a pressure range greater than 5 bar.

In another embodiment, an interconnection structure includes a barrier layer formed in an opening defined in a material layer disposed on a substrate, an interface layer disposed on the barrier layer, and a gap filling layer disposed on the interface layer, wherein the gap filling layer has an average grain size greater than 10 nm.

In yet another embodiment, a method for forming an interconnection structure includes forming a gap filling layer formation process by repeatedly performing a deposition process and a plasma treatment process until a predetermined thickness of a gap filling layer is obtained, and performing an annealing process on the gap filling layer at a pressure greater than 5 bar while supplying hydrogen or hydrogen isotope containing gas.

BRIEF DESCRIPTION OF THE DRAWINGS

So that the manner in which the above recited features of the present disclosure can be understood in detail, a more particular description of the disclosure, briefly summarized above, can be had by reference to embodiments, some of which are illustrated in the appended drawings. It is to be noted, however, that the appended drawings illustrate only typical embodiments of this disclosure and are therefore not to be considered limiting of its scope, for the disclosure can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for forming a metal containing interconnection structure on a substrate with good gap filling performance in a semiconductor device are provided. In one example, a pre-cleaning process, a barrier layer deposition process, an interface layer deposition process, a gap filling layer deposition process and a high pressure annealing process are performed to fill an opening in a material layer disposed on a substrate with good gap filling performance. Furthermore, the pre-cleaning process, the barrier layer deposition process, the interface layer deposition process and the gap filling layer deposition process may be formed in the cluster processing system without breaking vacuum (e.g., substrate without exposure to the atmosphere while in the cluster processing system) so that the likelihood of contamination and pollution from the air or from the environment can be substantially eliminated. The high pressure annealing process performed after the barrier layer, interface layer and the gap filling layer are formed may assist enhancing the grain structure of the gap filling layer, thus improving the film qualities and purities in the gap filling layer.

Figure 1:
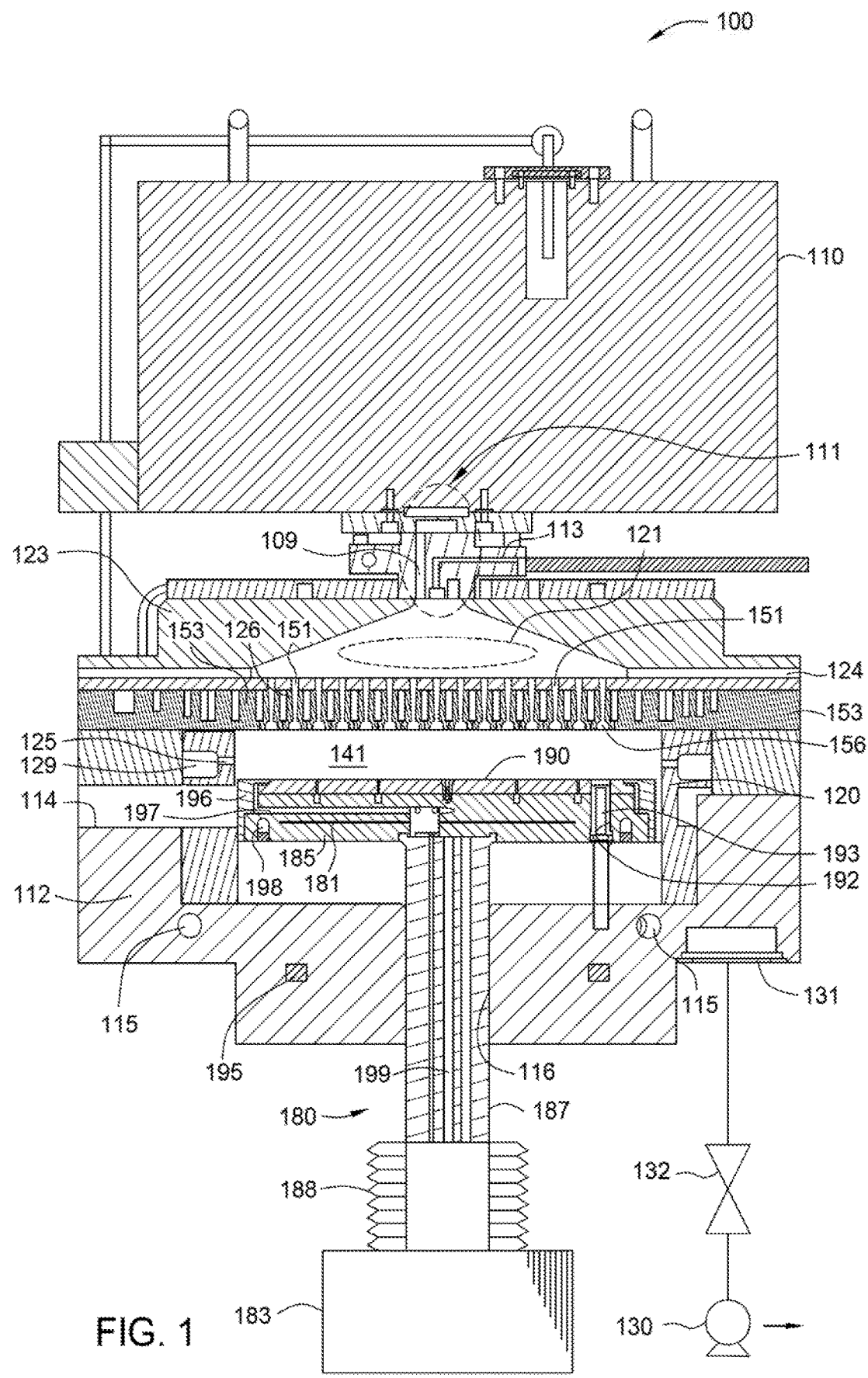
FIG. 1 depicts a pre-clean processing chamber which may be utilized to perform a pre-clean process on a substrate.

FIG. 1 is a cross sectional view of an illustrative processing chamber 100 suitable for performing a substrate pre-cleaning process as further described below. The processing chamber 100 may be configured to remove native oxide, or surface contamination from a substrate surface. The processing chamber 100 is particularly useful for performing the remote plasma surface cleaning process. The processing chamber 100 may be a Frontier™, PCxT Reactive Preclean™ (RPC), AKTIV Pre-Clean™, Siconi™ or Capa™ chamber, which is available from Applied Materials, Santa Clara, Calif. It is noted that other vacuum processing chambers available from other manufactures may also be adapted to practice the present disclosure.

The processing chamber 100 includes a chamber body 112, a lid assembly 123, and a support assembly 180. The lid assembly 123 is disposed at an upper end of the chamber body 112, and the support assembly 180 is at least partially disposed within the chamber body 112.

The chamber body 112 includes a slit valve opening 114 formed in a sidewall thereof to provide access to the interior of the processing chamber 100. The slit valve opening 114 is selectively opened and closed to allow access to the interior of the chamber body 112 by a wafer handling robot (not shown).

In one or more implementations, the chamber body 112 includes a channel 115 formed therein for flowing a heat transfer fluid therethrough. The chamber body 112 can further include a liner 120 that surrounds the support assembly 180. The liner 120 is removable for servicing and cleaning. In one or more embodiments, the liner 120 includes one or more apertures 125 and a pumping channel 129 formed therein that is in fluid communication with a vacuum system. The apertures 125 provide a flow path for gases into the pumping channel 129, which provides an egress for the gases within the processing chamber 100.

The vacuum system can include a vacuum pump 130 and a throttle valve 132 to regulate flow of gases through the processing chamber 100. The vacuum pump 130 is coupled to a vacuum port 131 disposed in the chamber body 112 and therefore, in fluid communication with the pumping channel 129 formed within the liner 120.

A remote plasma system 110 may process a halogen containing precursor, for example fluorine-containing precursor, which then travels through a gas inlet assembly 111. Two distinct gas supply channels (a first channel 109 and a second channel 113) are visible within the gas inlet assembly 111. The first channel 109 carries a gas that passes through the remote plasma system 110 (RPS), while the second channel 113 bypasses the remote plasma system 110. Either channel 109, 113 may be used for the halogen-containing precursor. On the other hand, the first channel 109 may be used for the process gas and the second channel 113 may be used for a treatment gas. A lid assembly (or conductive top portion) 123 and a perforated partition 153 (or a showerhead) are shown with an insulating ring 124 in between, which allows an AC potential to be applied to the lid assembly 123 relative to the perforated partition 153. The AC potential strikes a plasma in a chamber plasma region 121. The process gas may travel through the first channel 109 into the chamber plasma region 121 and may be excited by a plasma in the chamber plasma region 121 alone or in combination with the remote plasma system 110. If the process gas flows through the second channel 113, then only the chamber plasma region 121 is used for excitation. The combination of the chamber plasma region 121 and/or the remote plasma system 110 may be referred to as a remote plasma system herein. The perforated partition (also referred to as a showerhead) 153 separates the chamber plasma region 121 from a substrate processing region 141 beneath the perforated partition 153. The perforated partition 153 allows a plasma present in the chamber plasma region 121 to avoid directly exciting gases in the substrate processing region 141, while still allowing excited species to travel from the chamber plasma region 121 into the substrate processing region 141.

The perforated partition 153 is positioned between the chamber plasma region 121 and the substrate processing region 141 and allows plasma effluents (excited derivatives of precursors or other gases) created within remote plasma system 110 and/or the chamber plasma region 121 to pass through a plurality of through-holes 156. The perforated partition 153 also has one or more hollow volumes 151 which can be filled with a precursor in the form of a vapor or gas and pass through the through-holes 156 into the substrate processing region 141 but not directly into the chamber plasma region 121. In order to maintain a significant concentration of excited species penetrating from the chamber plasma region 121 to the substrate processing region 141, the length 126 of the through-holes 156 may be restricted and configured in different configurations as needed.

The perforated partition 153 may be configured to serve as an ion suppressor as shown in FIG. 1. Alternatively, a separate processing chamber element may be included (not shown) which suppresses the ion concentration traveling into the substrate processing region 141. The lid assembly 123 and the perforated partition 153 may function as a first electrode and second electrode, respectively, so that the lid assembly 123 and the perforated partition 153 may receive different electric voltages. In these configurations, electrical power (e.g., RF power) may be applied to the lid 123, the perforated partition 153, or both. For example, the electrical power may be applied to the lid assembly 123 while the perforated partition 153 (serving as ion suppressor) is grounded. The substrate processing chamber 100 may include a RF generator that provides the electrical power to the lid assembly 123 and/or the perforated partition 153 as needed. The voltage applied to the lid assembly 123 may facilitate a uniform distribution of plasma (i.e., reduce localized plasma) within the chamber plasma region 121. To enable the formation of a plasma in the chamber plasma region 121, the insulating ring 124 may electrically insulate the lid assembly 123 from the perforated partition 153. The insulating ring 124 may be made from a ceramic and may have a high breakdown voltage to avoid sparking. Portions of substrate processing chamber 100 near the capacitively-coupled plasma components just described may further include a cooling unit (not shown) that includes one or more cooling fluid channels to cool surfaces exposed to the plasma with a circulating coolant (e.g., water).

In the embodiment shown, the perforated partition 153 may distribute (via through-holes 156) process gases which contain hydrogen, fluorine and/or plasma effluents of such process gases upon excitation by a plasma in the chamber plasma region 121. In embodiments, the process gas introduced into the remote plasma system 110 and/or the chamber plasma region 121 may contain fluorine (such as $F_2$ or HF). The process gas may also include a carrier gas such as helium, argon, hydrogen ($H_2$), etc. Plasma effluents may include ionized or neutral derivatives of the process gas and may also be referred to herein as radical-fluorine referring to the atomic constituent of the process gas introduced.

The through-holes 156 are configured to suppress the migration of ionically-charged species out of the chamber plasma region 121 while allowing uncharged neutral or radical species to pass through the perforated partition 153 into the substrate processing region 141. These uncharged species may include highly reactive species that are transported with less-reactive carrier gas by the through-holes 156. As noted above, the migration of ionic species by the through-holes 156 may be reduced, and in some instances completely suppressed. Controlling the amount of ionic species passing through the perforated partition 153 provides increased control over the gas mixture brought into contact with the underlying wafer substrate, which in turn increases control of the deposition and/or etch characteristics of the gas mixture. For example, adjustments in the ion concentration of the gas mixture can significantly alter its etch selectivity (e.g., silicon nitride/oxide:silicon etch ratios).

In embodiments, the number of the through-holes 156 may be between about 60 and about 2000. The through-holes 156 may have a variety of shapes but are most easily made round. There is also latitude in choosing the cross-sectional shape of through-holes, which may be made conical, cylindrical or combinations of the two shapes. The through-holes 156 may be configured to control the passage of the plasma-activated gas (i.e., the ionic, radical, and/or neutral species) through the perforated partition 153. For example, the aspect ratio of the holes (i.e., the hole diameter to length) and/or the geometry of the holes may be controlled so that the flow of ionically-charged species in the activated gas passing through the perforated partition 153 is reduced. The through-holes 156 in the perforated partition 153 may include a tapered portion that faces the chamber plasma region 121, and a cylindrical portion that faces the substrate processing region 141. The cylindrical portion may be proportioned and dimensioned to control the flow of ionic species passing into the substrate processing region 141. An adjustable electrical bias may also be applied to the perforated partition 153 as an additional means to control the flow of ionic species through the perforated partition 153.

Alternatively, the through-holes 156 may have a smaller inner diameter (ID) toward the top surface of the perforated partition 153 and a larger ID toward the bottom surface. In addition, the bottom edge of the through-holes 156 may be chamfered to help evenly distribute the plasma effluents in the substrate processing region 141 as the plasma effluents exit the showerhead and promote even distribution of the plasma effluents and precursor gases. The smaller ID may be placed at a variety of locations along the through-holes 156 and still allow the perforated partition 153 to reduce the ion density within the substrate processing region 141. The reduction in ion density results from an increase in the number of collisions with walls prior to entry into the substrate processing region 141. Each collision increases the probability that an ion is neutralized by the acquisition or loss of an electron from the wall. Generally speaking, the smaller ID of the through-holes 156 may be between about 0.2 mm and about 20 mm. In other embodiments, the smaller ID may be between about 1 mm and 6 mm or between about 0.2 mm and about 5 mm. Further, aspect ratios of the through-holes 156 (i.e., the smaller ID to hole length) may be approximately 1 to 20. The smaller ID of the through-holes 156 may be the minimum ID found along the length of the through-holes. The cross sectional shape of through-holes 156 may be generally cylindrical, conical, or any combination thereof.

The support assembly 180 can include a support member 185 to support a substrate (not shown in FIG. 1) for processing within the chamber body 112. The support member 185 can be coupled to a lift mechanism 183 through a shaft 187 which extends through a centrally-located opening 116 formed in a bottom surface of the chamber body 112. The lift mechanism 183 can be flexibly sealed to the chamber body 112 by a bellows 188 that prevents vacuum leakage from around the shaft 187.

The support member 185 can include bores 192 formed therethrough to accommodate lift pins 193, one of which is shown in FIG. 1. Each lift pin 193 is constructed of ceramic or ceramic-containing materials, and are used for substrate-handling and transport. The lift pin 193 is moveable within its respective bore 192 when engaging an annular lift ring 195 disposed within the chamber body 112. The support assembly 180 can further include an edge ring 196 disposed about the support member 185.

The temperature of the support assembly 180 can be controlled by a fluid circulated through a fluid channel 198 embedded in the body of the support member 185. In one or more implementations, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 can flow heat transfer fluids to either heat or cool the support member 185. Any suitable heat transfer fluid may be used, such as water, nitrogen, ethylene glycol, or mixtures thereof. The support assembly 180 can further include an embedded thermocouple (not shown) for monitoring the temperature of the support surface of the support member 185. For example, a signal from the thermocouple may be used in a feedback loop to control the temperature or flow rate of the fluid circulated through the fluid channel 198.

The support member 185 can be moved vertically within the chamber body 112 so that a distance between support member 185 and the lid assembly 140 can be controlled. A sensor (not shown) can provide information concerning the position of support member 185 within processing chamber 100.

A system controller (not shown) can be used to regulate the operations of the processing chamber 100. The system controller can operate under the control of a computer program stored in a memory of the controller or other memory source. The computer program may include instructions that enable the preclean process described below to be performed in the processing chamber 100. For example, the computer program can dictate the process sequencing and timing, mixture of gases, chamber pressures, RF power levels, susceptor positioning, slit valve opening and closing, wafer cooling and other parameters of a particular process.

Figure 2:
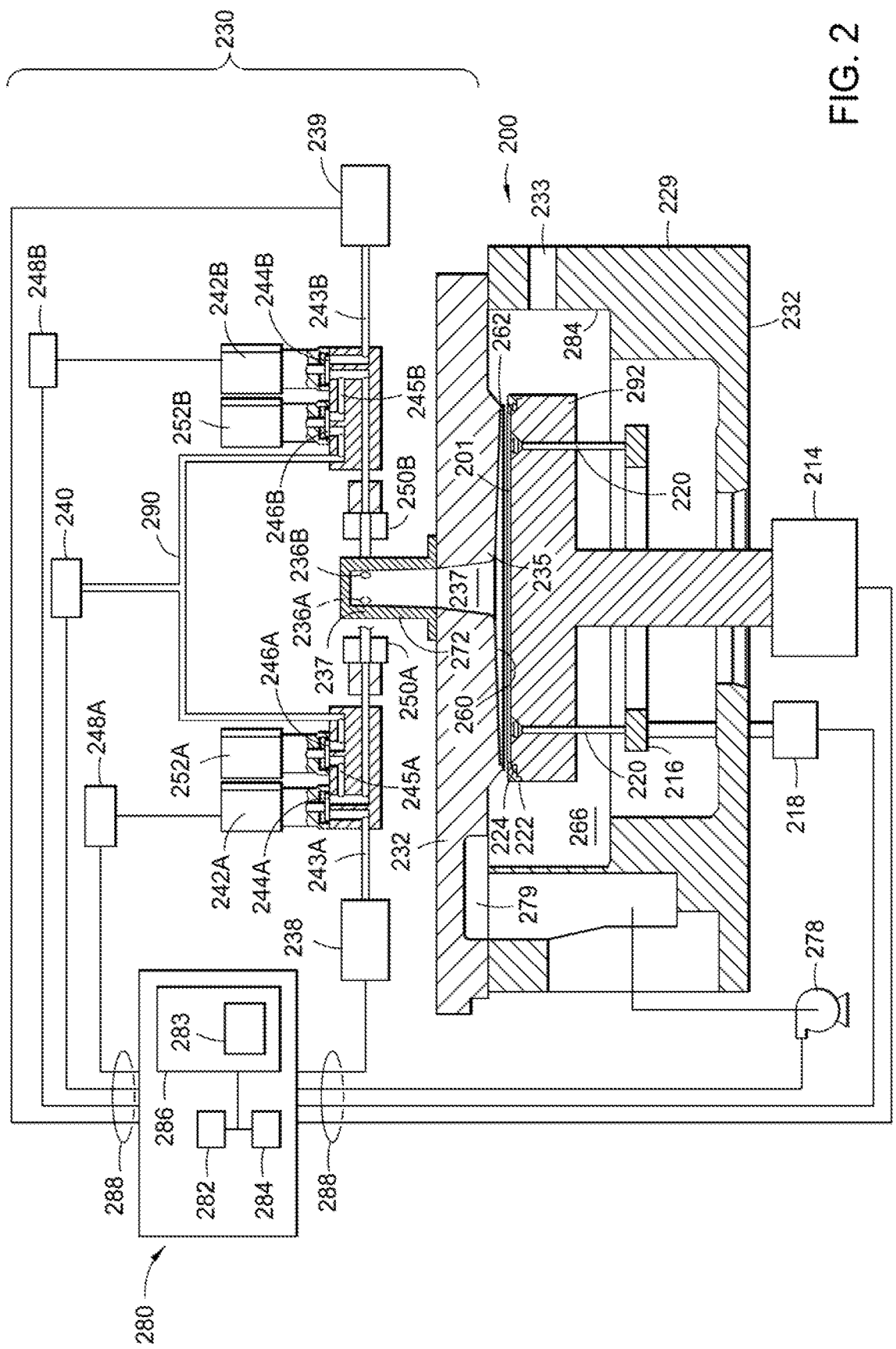
FIG. 2 depicts an apparatus that may be utilized to perform an atomic layer deposition (ALD) processing process in accordance with one embodiment of the present disclosure.

FIG. 2 is a schematic cross-sectional view of one embodiment of an atomic layer deposition (ALD) processing chamber 200. The ALD processing chamber 200 includes a gas delivery apparatus 230 adapted for cyclic deposition, such as ALD or chemical vapor deposition (CVD). The terms ALD and CVD as used herein refer to the sequential introduction of reactants to deposit a thin layer over a substrate structure. The sequential introduction of reactants may be repeated to deposit a plurality of thin layers to form a conformal layer to a desired thickness. The chamber 200 may also be adapted for other deposition techniques along with lithography process.

The chamber 200 comprises a chamber body 229 having a bottom 232. A slit valve tunnel 233 formed through the chamber body 229 provides access for a robot (not shown) to deliver and retrieve a substrate 201, such as a 200 mm, 300 mm or 450 mm semiconductor substrate or a glass substrate, from the chamber 200.

A substrate support 292 is disposed in the chamber 200 and supports the substrate 201 during processing. The substrate support 292 is mounted to a lift 214 to raise and lower the substrate support 292 and the substrate 201 disposed thereon. A lift plate 216 is connected to a lift plate actuator 218 that controls the elevation of the lift plate 216. The lift plate 216 may be raised and lowered to raise and lower pins 220 movably disposed through the substrate support 292. The pins 220 are utilized to raise and lower the substrate 201 over the surface of the substrate support 292. The substrate support 292 may include a vacuum chuck, an electrostatic chuck, or a clamp ring for securing the substrate 201 to the surface of the substrate support 292 during processing.

The substrate support 292 may be heated to heat the substrate 201 disposed thereon. For example, the substrate support 292 may be heated using an embedded heating element, such as a resistive heater, or may be heated using radiant heat, such as heating lamps disposed above the substrate support 292. A purge ring 222 may be disposed on the substrate support 292 to define a purge channel 224 which provides a purge gas to a peripheral portion of the substrate 201 to prevent deposition thereon.

A gas delivery apparatus 230 is disposed at an upper portion of the chamber body 229 to provide a gas, such as a process gas and/or a purge gas, to the chamber 200. A pumping system 278 is in communication with a pumping channel 279 to evacuate any desired gases from the chamber 200 and to help maintain a desired pressure or a desired pressure range inside a pumping zone 166 of the chamber 200.

In one embodiment, the gas delivery apparatus 230 comprises a chamber lid 232. The chamber lid 232 includes an expanding channel 237 extending from a central portion of the chamber lid 232 and a bottom surface 260 extending from the expanding channel 237 to a peripheral portion of the chamber lid 232. The bottom surface 260 is sized and shaped to substantially cover the substrate 201 disposed on the substrate support 292. The chamber lid 232 may have a choke 262 at a peripheral portion of the chamber lid 232 adjacent the periphery of the substrate 201. The cap portion 272 includes a portion of the expanding channel 237 and gas inlets 236A, 236B. The expanding channel 237 has gas inlets 236A, 236B to provide gas flows from two similar valves 242A, 242B. The gas flows from the valves 242A, 242B may be provided together and/or separately.

In one configuration, valve 242A and valve 242B are coupled to separate reactant gas sources, but are coupled to the same purge gas source. For example, valve 242A is coupled to a reactant gas source 238 and valve 242B is coupled to reactant gas source 239, which both valves 242A, 242B are coupled to purge a gas source 240. Each valve 242A, 242B includes a delivery line 243A, 243B having a valve seat assembly 244A, 244B and includes a purge line 245A, 245B having a valve seat assembly 246A, 246B. The delivery line 243A, 243B is in communication with the reactant gas source 238, 239 and is in communication with the gas inlet 237A, 237B of the expanding channel 290. The valve seat assembly 244A, 244B of the delivery line 243A, 243B controls the flow of the reactant gas from the reactant gas source 238, 239 to the expanding channel 290. The purge line 245A, 245B is in communication with the purge gas source 240 and intersects the delivery line 243A, 243B downstream of the valve seat assembly 244A, 244B of the delivery line 243A, 243B. The valve seat assembly 246A, 246B of the purge line 245A, 245B controls the flow of the purge gas from the purge gas source 240 to the delivery line 243A, 243B. If a carrier gas is used to deliver reactant gases from the reactant gas source 238, 239, the same gas may be used as a carrier gas and a purge gas (i.e., an argon gas may be used as both a carrier gas and a purge gas).

Each valve 242A, 242B may be a zero dead volume valve to enable flushing of a reactant gas from the delivery line 243A, 243B when the valve seat assembly 244A, 244B of the valve is closed. For example, the purge line 245A, 245B may be positioned adjacent the valve seat assembly 244A, 244B of the delivery line 243A, 243B. When the valve seat assembly 244A, 244B is closed, the purge line 245A, 245B may provide a purge gas to flush the delivery line 243A, 243B. In the embodiment shown, the purge line 245A, 245B is positioned as slightly spaced from the valve seat assembly 244A, 244B of the delivery line 243A, 243B so that a purge gas is not directly delivered into the valve seat assembly 244A, 244B when open. A zero dead volume valve as used herein is defined as a valve which has negligible dead volume (i.e., not necessary zero dead volume.) Each valve 242A, 242B may be adapted to provide a combined gas flow and/or separate gas flow of the reactant gas from the sources 238, 239 and the purge gas from the source 240. The pulses of the purge gas may be provided by opening and closing a diaphragm of the valve seat assembly 246A of the purge line 245A. The pulses of the reactant gas from the reactant gas source 238 may be provided by opening and closing the valve seat assembly 244A of the delivery line 243A.

A control unit 280 may be coupled to the chamber 200 to control processing conditions. The control unit 280 comprises a central processing unit (CPU) 282, support circuitry 284, and memory 186 containing associated control software 283. The control unit 280 may be one of any form of general purpose computer processors that can be used in an industrial setting for controlling various chambers and sub-processors. The CPU 282 may use any suitable memory 186, such as random access memory, read only memory, floppy disk drive, compact disc drive, hard disk, or any other form of digital storage, local or remote. Various support circuits may be coupled to the CPU 282 for supporting the chamber 200. The control unit 280 may be coupled to another controller that is located adjacent individual chamber components, such as the programmable logic controllers 248A, 248B of the valves 242A, 242B. Bi-directional communications between the control unit 280 and various other components of the chamber 200 are handled through numerous signal cables collectively referred to as signal buses 288, some of which are illustrated in FIG. 2. In addition to the control of process gases and purge gases from gas sources 238, 239, 240 and from the programmable logic controllers 248A, 248B of the valves 242A, 242B, the control unit 280 may be configured to be responsible for automated control of other activities used in substrate processing, such as substrate transport, temperature control, chamber evacuation, among other activities, some of which are described elsewhere herein.

Figure 3:
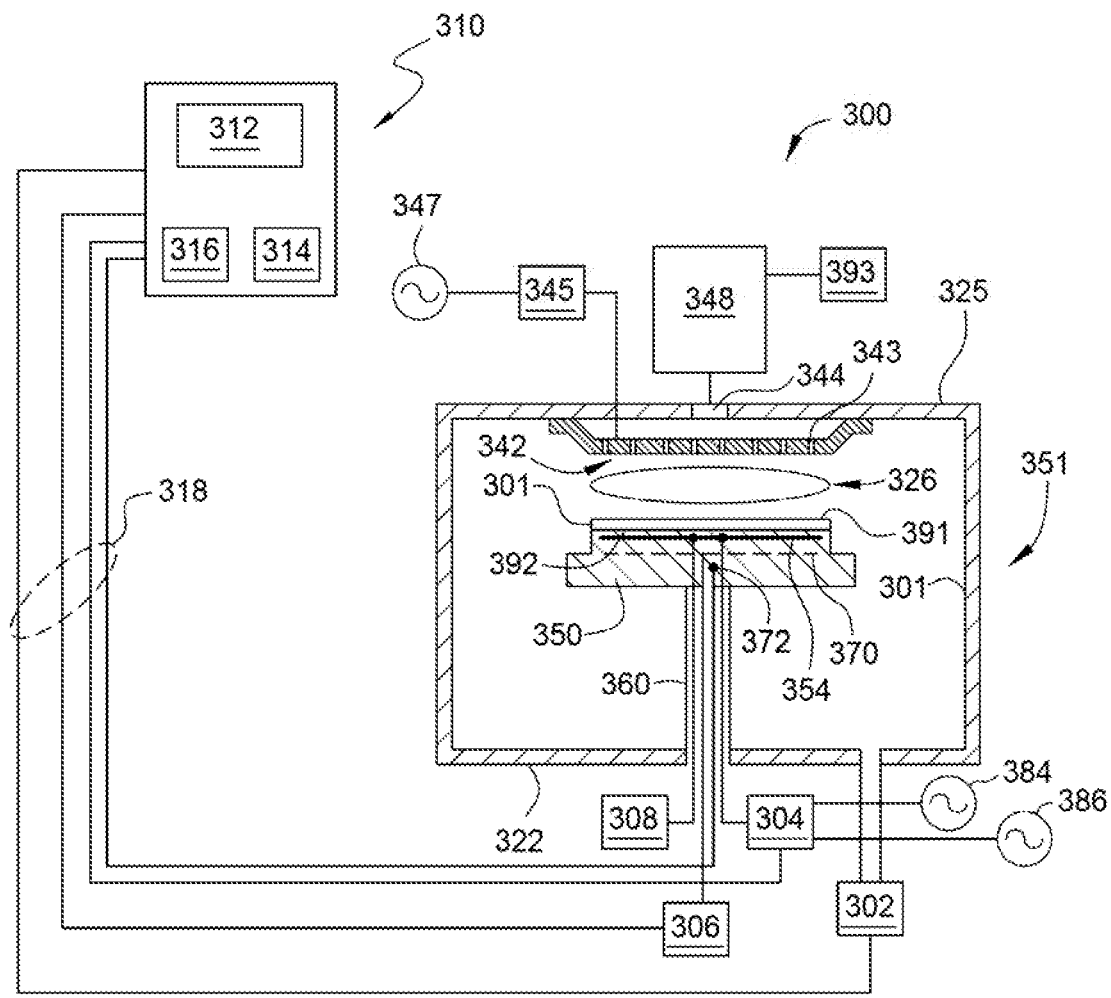
FIG. 3 depicts an apparatus may be utilized to perform an chemical vapor deposition (CVD) processing process in accordance with one embodiment of the present disclosure.

FIG. 3 is a cross sectional view of a processing chamber 300 suitable for performing a plasma deposition process (e.g., a plasma enhanced CVD or a metal organic CVD) that may be utilized as semiconductor interconnection structures for semiconductor devices manufacture. The processing chamber 300 may be a suitably adapted CENTURA®, PRODUCER® SE or PRODUCER® GT or PRODUCER® XP processing system available from Applied Materials, Inc., of Santa Clara, Calif. It is contemplated that other processing systems, including those produced by other manufacturers, may benefit from embodiments described herein.

The processing chamber 300 includes a chamber body 351. The chamber body 351 includes a lid 325, a sidewall 303 and a bottom wall 322 that define an interior volume 326.

A substrate support pedestal 350 is provided in the interior volume 326 of the chamber body 351. The pedestal 350 may be fabricated from aluminum, ceramic, aluminum nitride, and other suitable materials. In one embodiment, the pedestal 350 is fabricated by a ceramic material, such as aluminum nitride, which is a material suitable for use in a high temperature environment, such as a plasma process environment, without causing thermal damage to the pedestal 350. The pedestal 350 may be moved in a vertical direction inside the chamber body 351 using a lift mechanism (not shown).

The pedestal 350 may include an embedded heater element 370 suitable for controlling the temperature of a substrate 301 supported on the pedestal 350. In one embodiment, the pedestal 350 may be resistively heated by applying an electric current from a power supply 306 to the heater element 370. In one embodiment, the heater element 370 may be made of a nickel-chromium wire encapsulated in a nickel-iron-chromium alloy (e.g., INCOLOY®) sheath tube. The electric current supplied from the power supply 306 is regulated by the controller 310 to control the heat generated by the heater element 370, thus maintaining the substrate 301 and the pedestal 350 at a substantially constant temperature during film deposition at any suitable temperature range. In another embodiment, the pedestal may be maintained at room temperature as needed. In yet another embodiment, the pedestal 350 may also include a chiller (not shown) as needed to cool the pedestal 350 at a range lower than room temperature as needed. The supplied electric current may be adjusted to selectively control the temperature of the pedestal 350 between about 20 degrees Celsius to about 700 degrees Celsius.

A temperature sensor 372, such as a thermocouple, may be embedded in the substrate support pedestal 350 to monitor the temperature of the pedestal 350 in a conventional manner. The measured temperature is used by the controller 310 to control the power supplied to the heater element 370 to maintain the substrate at a desired temperature.

The pedestal 350 generally includes a plurality of lift pins (not shown) disposed therethrough that are configured to lift the substrate 301 from the pedestal 350 and facilitate exchange of the substrate 301 with a robot (not shown) in a conventional manner.

The pedestal 350 comprises at least one electrode 392 for retaining the substrate 301 on the pedestal 350. The electrode 392 is driven by a chucking power source 308 to develop an electrostatic force that holds the substrate 301 to the pedestal surface, as is conventionally known. Alternatively, the substrate 301 may be retained to the pedestal 350 by clamping, vacuum or gravity.

In one embodiment, the pedestal 350 is configured as a cathode having the electrode 392 embedded therein coupled to at least one RF bias power source, shown in FIG. 3 as two RF bias power sources 384, 386. Although the example depicted in FIG. 3 shows two RF bias power sources, 384, 386, it is noted that the number of the RF bias power sources may be any number as needed. The RF bias power sources 384, 386 are coupled between the electrode 392 disposed in the pedestal 350 and another electrode, such as a gas distribution plate 342 or lid 325 of the processing chamber 300. The RF bias power source 384, 386 excites and sustains a plasma discharge formed from the gases disposed in the processing region of the processing chamber 300.

In the embodiment depicted in FIG. 3, the dual RF bias power sources 384, 386 are coupled to the electrode 392 disposed in the pedestal 350 through a matching circuit 304. The signal generated by the RF bias power source 384, 386 is delivered through matching circuit 304 to the pedestal 350 through a single feed to ionize the gas mixture provided in the processing chamber 300, thereby providing ion energy necessary for performing a deposition or other plasma enhanced process. The RF bias power sources 384, 386 are generally capable of producing an RF signal having a frequency of from about 50 kHz to about 200 MHz and a power between about 0 Watts and about 5000 Watts.

It is noted that in one example depicted herein, the plasma is only turned on when a cleaning process is performed in the processing chamber 300 as needed.

A vacuum pump 302 is coupled to a port formed in the bottom 322 of the chamber body 351. The vacuum pump 302 is used to maintain a desired gas pressure in the chamber body 351. The vacuum pump 302 also evacuates post-processing gases and by-products of the process from the chamber body 351.

The processing chamber 300 includes one or more gas delivery passages 344 coupled through the lid 325 of the processing chamber 300. The gas delivery passages 344 and the vacuum pump 302 are positioned at opposite ends of the processing chamber 300 to induce laminar flow within the interior volume 326 to minimize particulate contamination.

The gas delivery passage 344 is coupled to the gas panel 393 through a remote plasma source (RPS) 348 to provide a gas mixture into the interior volume 326. In one embodiment, the gas mixture supplied through the gas delivery passage 344 may be further delivered through a gas distribution plate 342 disposed below the gas delivery passage 344. In one example, the gas distribution plate 342 having a plurality of apertures 343 is coupled to the lid 325 of the chamber body 351 above the pedestal 350. The apertures 343 of the gas distribution plate 342 are utilized to introduce process gases from the gas panel 393 into the chamber body 351. The apertures 343 may have different sizes, number, distributions, shape, design, and diameters to facilitate the flow of the various process gases for different process requirements. A plasma is formed from the process gas mixture exiting the gas distribution plate 342 to enhance thermal decomposition of the process gases resulting in the deposition of material on the surface 391 of the substrate 301.

The gas distribution plate 342 and substrate support pedestal 350 may be formed a pair of spaced apart electrodes in the interior volume 326. One or more RF sources 347 provide a bias potential through a matching network 345 to the gas distribution plate 342 to facilitate generation of a plasma between the gas distribution plate 342 and the pedestal 350. Alternatively, the RF sources 347 and matching network 345 may be coupled to the gas distribution plate 342, substrate support pedestal 350, or coupled to both the gas distribution plate 342 and the substrate support pedestal 350, or coupled to an antenna (not shown) disposed exterior to the chamber body 351. In one embodiment, the RF sources 347 may provide between about 10 Watts and about 3000 Watts at a frequency of about 30 kHz to about 13.6 MHz. Alternatively, the RF source 347 may be a microwave generator that provide microwave power to the gas distribution plate 342 that assists generation of the plasma in the interior volume 326.

In one embodiment, the remote plasma source (RPS) 348 may be alternatively coupled to the gas delivery passages 344 to assist in forming a plasma from the gases supplied from the gas panel 393 into the in the interior volume 326. The remote plasma source 348 provides plasma formed from the gas mixture provided by the gas panel 393 to the processing chamber 300.

The controller 310 includes a central processing unit (CPU) 312, a memory 316, and a support circuit 314 utilized to control the process sequence and regulate the gas flows from the gas panel 393. The CPU 312 may be of any form of a general purpose computer processor that may be used in an industrial setting. The software routines can be stored in the memory 316, such as random access memory, read only memory, floppy, or hard disk drive, or other form of digital storage. The support circuit 314 is conventionally coupled to the CPU 312 and may include cache, clock circuits, input/output systems, power supplies, and the like. Bi-directional communications between the controller 310 and the various components of the processing chamber 300 are handled through numerous signal cables collectively referred to as signal buses 318, some of which are illustrated in FIG. 3.

Figure 4:
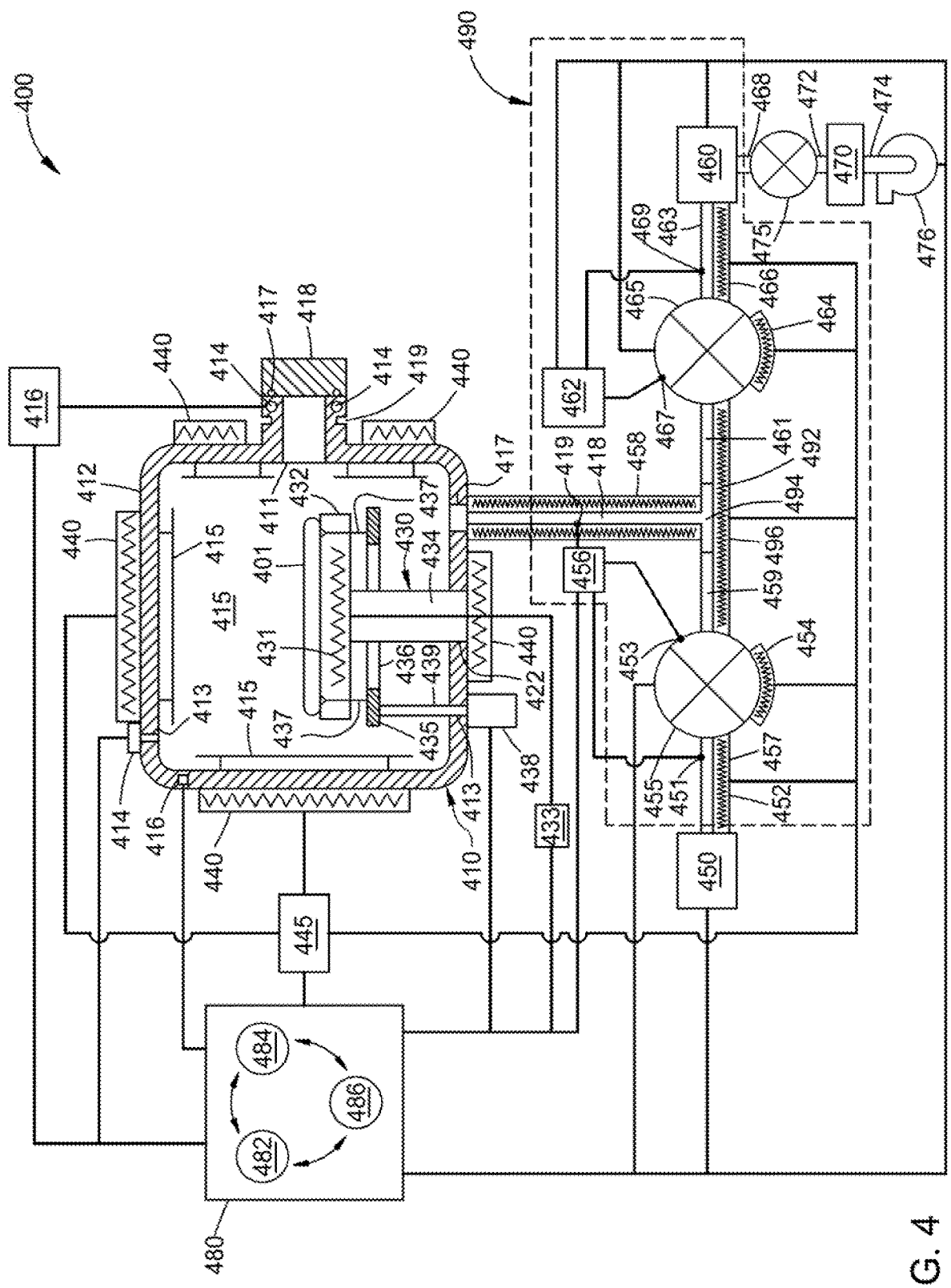
FIG. 4 depicts an apparatus may be utilized to perform a high pressure thermal annealing processing process in accordance with one embodiment of the present disclosure.

FIG. 4 is a simplified front cross-sectional view of a single-substrate processing chamber 400 for a high-pressure annealing process of a single substrate 401. The single-substrate processing chamber 400 has a body 410 with an outer surface 412 and an inner surface 413 that encloses an internal volume 415. In some embodiments such as in FIG. 4, the body 410 has an annular cross section, though in other embodiments, the cross-section of the body 410 may be rectangular or any closed shape. The outer surface 412 of the body 410 may be made from a corrosion resistant steel (CRS), such as but not limited to stainless steel. One or more heat shields 425 are disposed on the inner surface 413 of the body 410 that prevents heat loss from the single-substrate processing chamber 400 into the outside environment. The inner surface 413 of the body 410 as well as the heat shields 425 may be made from nickel-based steel alloys that exhibit high resistance to corrosion, such as but not limited to HASTELLOY®, ICONEL®, and MONEL®.

A substrate support 430 is disposed within the internal volume 415. The substrate support 430 has a stem 434 and a substrate-supporting member 432 held by the stem 434. The stem 434 passes through a passage 422 formed through the chamber body 410. A rod 439 connected to an actuator 438 passes through a second passage 423 formed through the chamber body 410. The rod 439 is coupled to a plate 435 having an aperture 436 accommodating the stem 434 of the substrate support 430. Lift pins 437 are connected to the substrate-supporting member 432. The actuator 438 actuates the rod 439 such that the plate 435 is moved up or down to connect and disconnect with the lift pins 437. As the lift pins 437 are raised or lowered, the substrate-supporting member 432 is raised or lowered within the internal volume 415 of the chamber 400. The substrate-supporting member 432 has a resistive heating element 431 embedded centrally within. A power source 433 is configured to electrically power the resistive heating element 431. The operation of the power source 433 as well as the actuator 438 is controlled by a controller 480.

The single-substrate processing chamber 400 has an opening 411 in the body 410 through which one or more substrates 400 can be loaded and unloaded to and from the substrate support 430 disposed in the internal volume 415. The opening 211 forms a tunnel 421 on the body 410. A slit valve 428 is configured to sealably close the tunnel 421 such that the opening 411 and the internal volume 415 can only be accessed when the slit valve 428 is open. A high-pressure seal 427 is utilized to seal the slit valve 428 to the body 410 in order to seal the internal volume 415 for processing. The high-pressure seal 427 may be made from a polymer, for example a fluoropolymer, such as but not limited to a perfluoroelastomer and polytetrafluoroethylene (PTFE). The high-pressure seal 427 may further include a spring member for biasing the seal to improve seal performance. A cooling channel 424 is disposed on the tunnel 421 adjacent to the high-pressure seals 427 in order to maintain the high-pressure seals 427 below the maximum safe-operating temperature of the high-pressure seals 427 during processing. A cooling agent from a cooling fluid source 426, such as but not limited to an inert, dielectric, and high-performance heat transfer fluid, may be circulated within the cooling channel 424. The flow of the cooling agent from the cooling fluid source 426 is controlled by the controller 480 through feedback received from a temperature sensor 416 or a flow sensor (not shown). An annular-shaped thermal choke 429 is formed around the tunnel 421 to prevent the flow of heat from the internal volume 415 through the opening 411 when the slit valve 428 is open.

The single-substrate processing chamber 400 has a port 417 through the body 410, which is fluidly connected to a fluid circuit 490 connecting the gas panel 450, the condenser 460 and the port 417. The fluid circuit 490 has a gas conduit 492, a source conduit 457, an inlet isolation valve 455, an exhaust conduit 463, and an outlet isolation valve 465. A number of heaters 496, 458, 452, 454, 464, 466 are interfaced with different portions of the fluid circuit 490. A number of temperature sensors 451, 453, 419, 467 and 469 are also placed at different portions of the fluid circuit 490 to take temperature measurements and send the information to the controller 480. The controller 480 uses the temperature measurement information to control the operation of the heaters 452, 454, 458, 496, 464, and 466 such that the temperature of the fluid circuit 490 is maintained at a temperature above the condensation point of the processing fluid disposed in the fluid circuit 490 and the internal volume 415.

The gas panel 450 is configured to provide a processing fluid under pressure the internal volume 415. The pressure of the processing fluid introduced into the internal volume 415 is monitored by a pressure sensor 414 coupled to the body 410. The condenser 460 is fluidly coupled to a cooling fluid source (not shown) and configured to condense the gas phase processing fluid exiting the internal volume 415 through the gas conduit 492. The condensed processing fluid is then removed by the pump 476. One or more heaters 440 are disposed on the body 410 and configured to heat the internal volume 415 within the single-substrate processing chamber 400. The heaters 440, 452, 454, 458, 496, 464, and 266 maintain the processing fluid within the fluid circuit 490 in a gaseous phase while the outlet isolation valve 465 to the condenser 460 is open to prevent condensation within the fluid circuit.

The controller 480 controls the operation of the single-substrate processing chamber 400. The controller 480 controls the operation of the gas panel 450, the condenser 460, the pump 470, the inlet isolation valve 455, the outlet isolation valve 465, and the power sources 433 and 445. The controller 480 is also communicatively connected to the temperature sensor 416, the pressure sensor 414, the actuator 438, the cooling fluid source 426 and the temperature reading devices 456 and 462.

The processing fluid may comprise an oxygen-containing and/or nitrogen-containing gas, and/or chalcogen or tellurium (such as S, Se, Te) gases or vapors such as oxygen, dry steam, water, hydrogen peroxide, hydrogen, deuterium, tritium, ammonia, S vapor, Se vapor, $H_2S$, $H_2Se$, etc. The processing fluid may be reacted with the metal materials on the substrate to purify the metal or to form metal oxynitrides, metal oxides, metal oxychalcogenides or metal chalcogenides.

During processing of the substrate 401, an environment of the internal volume 415 is maintained at a temperature and pressure that maintains the processing fluid within the high-pressure region in a vapor phase. Such pressure and temperature is selected based on the composition of the processing fluid. In the case of steam, the temperature and pressure is held at a condition that maintains the steam in a dry steam state. In one example, internal volume 415 is pressurized to a pressure greater than atmosphere, for example greater than about 5 bars. In another example, internal volume 415 is pressurized to a pressure from between about 10 and about 100 bars, such as from between about 20 and about 80 bars. In another example, the internal volume 415 is pressurized to a pressure up to about 100 bars. During processing, the internal volume 415 is also maintained at a high temperature, for example, a temperature exceeding 425 degrees Celsius (limited by the thermal budget of the substrates 401 disposed on the substrate-supporting member 432), such as between about 300 degrees Celsius and about 500 degrees.

Figure 5:
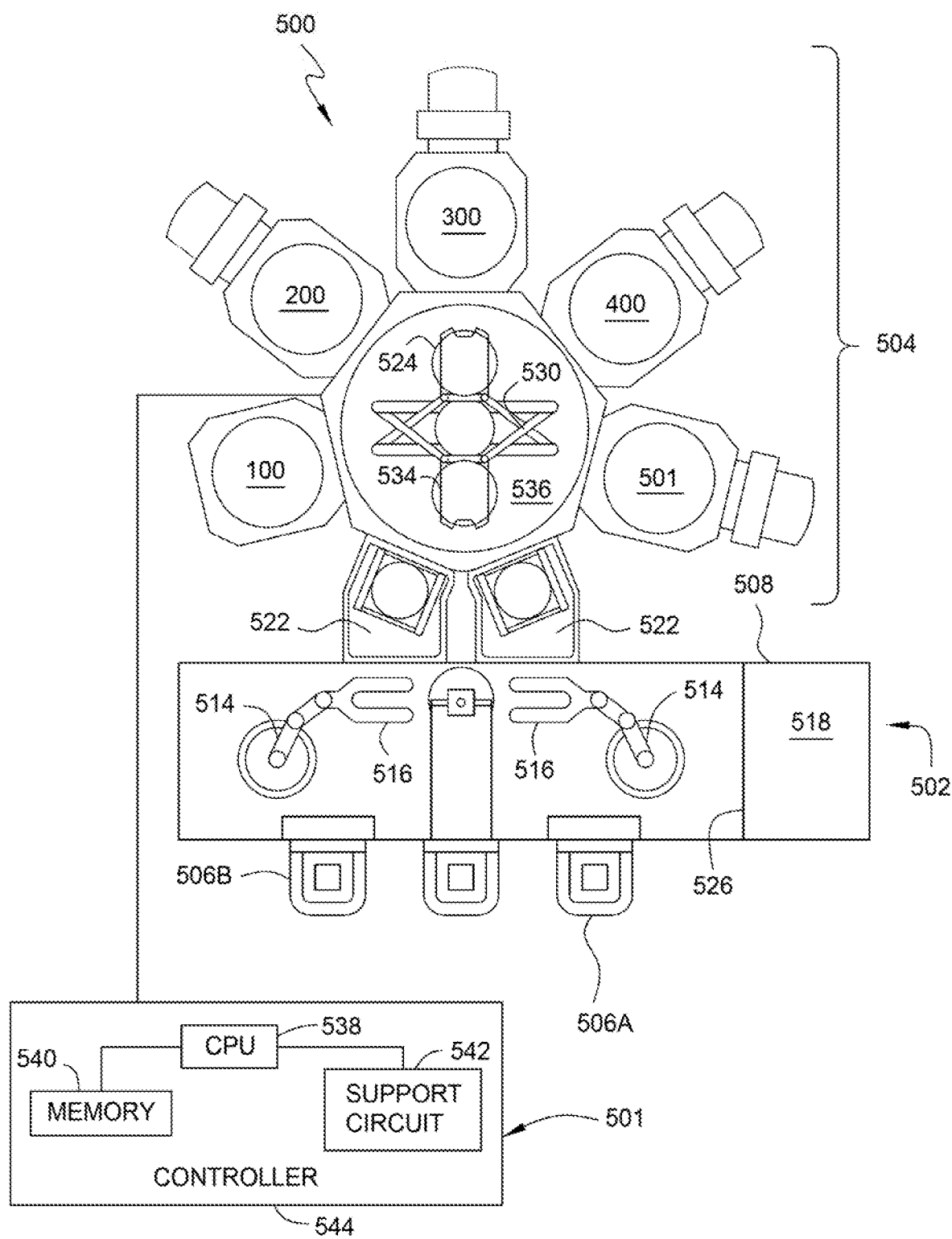
FIG. 5 depicts one embodiment of a cluster processing system that may have the processing chambers from FIGS. 1-4 to be incorporated thereto for practice one embodiment of the present disclosure.

FIG. 5 is a schematic, top plan view of an exemplary cluster processing system 500 that includes one or more of the processing chambers 100, 200, 300, 400 that are incorporated and integrated therein. In one embodiment, the cluster processing system 500 may be a CENTURA® or ENDURA® integrated processing system, commercially available from Applied Materials, Inc., located in Santa Clara, Calif. It is contemplated that other processing systems (including those from other manufacturers) may be adapted to benefit from the disclosure.

The cluster processing system 500 includes a vacuum-tight processing platform 504, a factory interface 502, and a system controller 544. The platform 504 includes a plurality of processing chambers 100, 200, 300, 400 and at least one load-lock chamber 522 that is coupled to a vacuum substrate transfer chamber 536. Two load lock chambers 522 are shown in FIG. 5. The factory interface 502 is coupled to the transfer chamber 536 by the load lock chambers 522.

In one embodiment, the factory interface 502 comprises at least one docking station 508 and at least one factory interface robot 514 to facilitate transfer of substrates. The docking station 508 is configured to accept one or more front opening unified pod (FOUP). Two FOUPS 506A-B are shown in the embodiment of FIG. 5. The factory interface robot 514 having a blade 516 disposed on one end of the robot 514 is configured to transfer the substrate from the factory interface 502 to the processing platform 504 for processing through the load lock chambers 522. Optionally, one or more metrology stations 518 may be connected to a terminal 526 of the factory interface 502 to facilitate measurement of the substrate from the FOUPS 506A-B.

Each of the load lock chambers 522 have a first port coupled to the factory interface 502 and a second port coupled to the transfer chamber 536. The load lock chambers 522 are coupled to a pressure control system (not shown) which pumps down and vents the load lock chambers 522 to facilitate passing the substrate between the vacuum environment of the transfer chamber 536 and the substantially ambient (e.g., atmospheric) environment of the factory interface 502.

The transfer chamber 536 has a vacuum robot 530 disposed therein. The vacuum robot 530 has a blade 534 capable of transferring substrates 524 among the load lock chambers 522, the metrology system 510 and the processing chambers 100, 200, 300, 400.

In one embodiment of the cluster processing system 500, the cluster processing system 500 may include one or more processing chambers 100, 200, 300, 400, which may be a deposition chamber (e.g., physical vapor deposition chamber, chemical vapor deposition, atomic layer deposition or other deposition chambers), annealing chamber (e.g., high pressure annealing chamber, RTP chamber, laser anneal chamber), etch chamber, cleaning chamber, pre-cleaning chamber, curing chamber, lithographic exposure chamber, or other similar type of semiconductor processing chambers. In some embodiments of the cluster processing system 500, one or more of processing chambers 100, 200, 300, 400, the transfer chamber 536, the factory interface 502 and/or at least one of the load lock chambers 522.

The system controller 544 is coupled to the cluster processing system 500. The system controller 544, which may include the computing device 501 or be included within the computing device 501, controls the operation of the cluster processing system 500 using a direct control of the process chambers 100, 200, 300, 400 of the cluster processing system 500. Alternatively, the system controller 544 may control the computers (or controllers) associated with the process chambers 100, 200, 300, 400 and the cluster processing system 500. In operation, the system controller 544 also enables data collection and feedback from the respective chambers to optimize performance of the cluster processing system 500.

The system controller 544, much like the computing device 501 described above, generally includes a central processing unit (CPU) 538, a memory 540, and support circuits 542. The CPU 538 may be one of any form of a general purpose computer processor that can be used in an industrial setting. The support circuits 542 are conventionally coupled to the CPU 538 and may comprise cache, clock circuits, input/output subsystems, power supplies, and the like. The software routines transform the CPU 538 into a specific purpose computer (controller) 544. The software routines may also be stored and/or executed by a second controller (not shown) that is located remotely from the cluster processing system 500.

Figure 6:
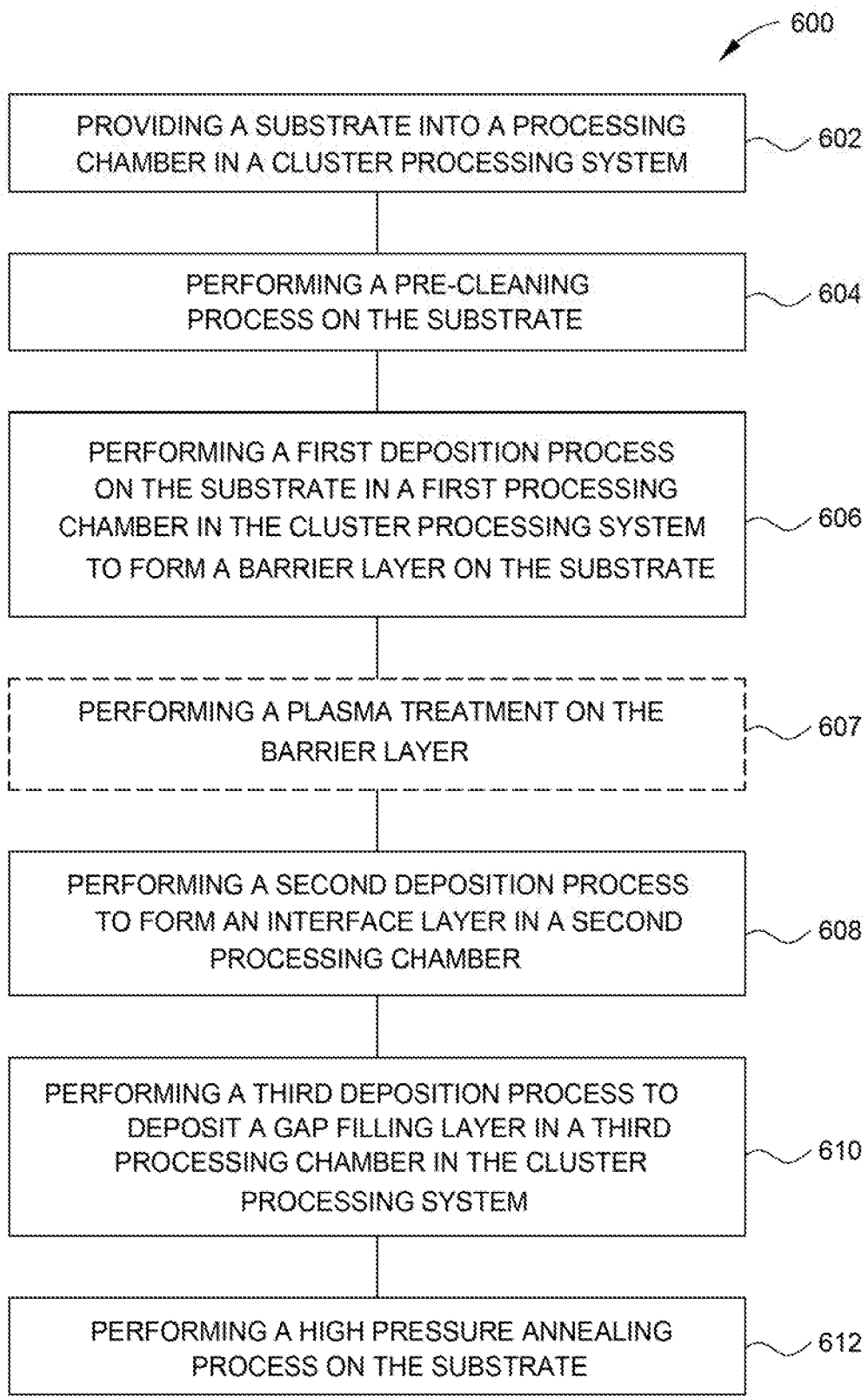
FIG. 6 depicts a flow diagram of an example of a method for forming a metal containing material on a substrate.

FIG. 6 is a flow diagram of one example of forming an interconnection structure, such as a barrier layer (or a liner layer), an interface layer and a gap filling material formed in an opening formed in a material layer for a semiconductor structure. It is noted that the barrier layer as referred here can be exchangeable to a liner layer as needed. The structure may be any suitable structure formed on a semiconductor substrate, such as a device or a channel structure with conductive and non-conductive areas, a fin structure, a gate structure, a contact structure, a front-end structure, a back-end structure or any other suitable structure utilized to fabricate semiconductor devices and the like. FIGS. 7A-7D are schematic cross-sectional views of a portion of a substrate 702 corresponding to various stages of the process 600. The process 600 may be utilized to form a contact or back-end interconnection structure which requires a gap filling layer formed in an opening with a small dimension (e.g., a width of a feature) less than 20 nm.

Figure 7A:
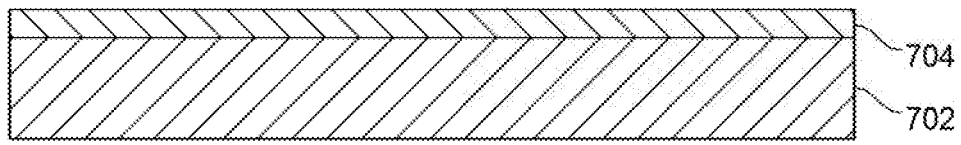
FIGS. 7A-7D depict one embodiment of a sequence for forming a metal containing material on the substrate during the manufacturing process according to the process depicted in FIG. 6.

The process 600 begins at operation 602 by providing a substrate, such as the substrate 702 as shown in FIG. 7A, for processing. In one embodiment, the substrate 702 may have an interconnection structure 750 to be formed on the substrate 702. The substrate 702 may have a substantially planar surface, an uneven surface, or a substantially planar surface having a structure formed thereon. The embodiment shown in FIGS. 7A-7D may be part of a surface, such as a bottom surface 822 of the substrate 702, exposed by an opening 850 formed in a material layer 802, as further shown in FIG. 8. The process 600 may assist forming multiple layers (e.g., more than one layer) in the opening 850 with small dimensions, such as less than 20 nm. Thus, the multiple layers provide a high gap filling capability that may be utilized to fill in the opening 850 with minimal defects, such as minimal voids, seems or gaps.

Figure 8:
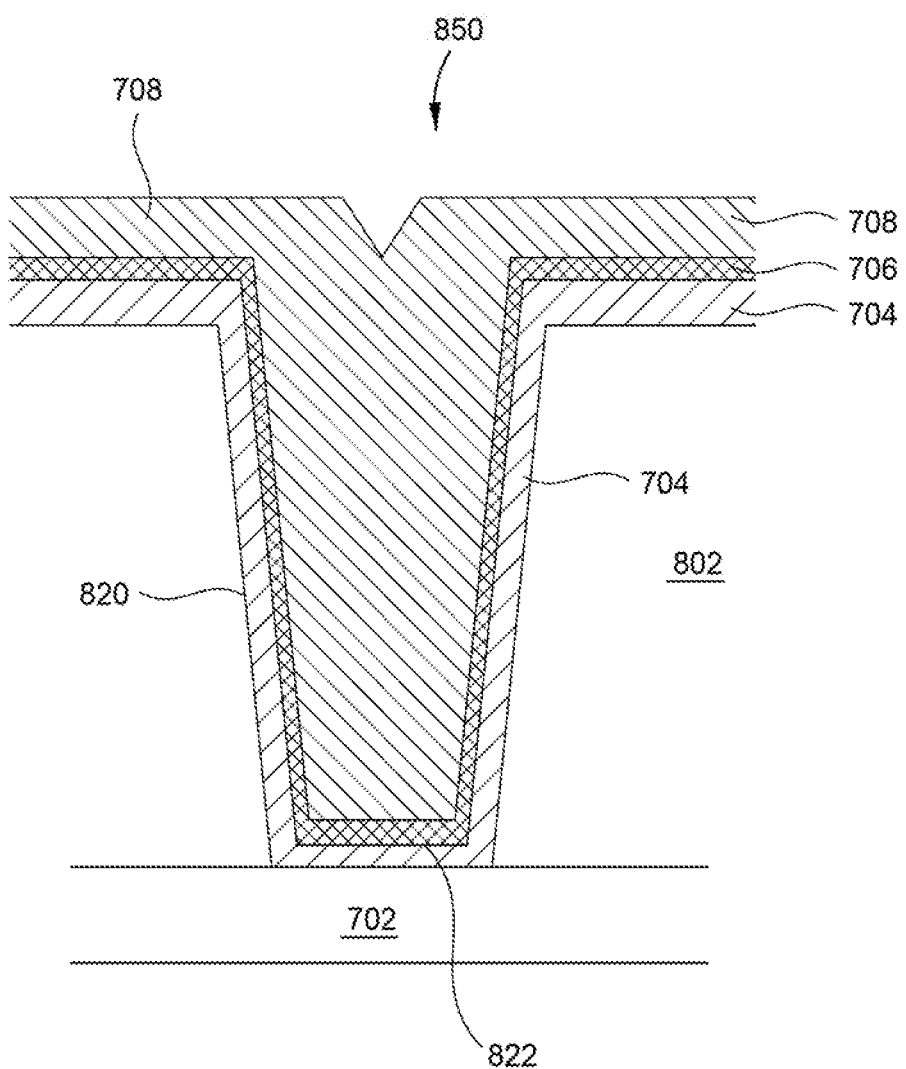
FIG. 8 depict a cross sectional view of an interconnection structure manufactured by the method of Figure for practice one embodiment of the present disclosure.

The substrate 702 shown in FIG. 8 includes a structure or a material layer 802 formed on the substrate 702. The opening 850 is formed in the material layer 802. In one embodiment, the substrate 702 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 702 may have various dimensions, such as 200 mm, 300 mm or 450 mm diameter wafers, as well as, rectangular or square panels. Unless otherwise noted, embodiments and examples described herein are conducted on substrates with a 300 mm diameter or a 450 mm diameter.

In one embodiment, the material layer 802 may be a dielectric layer. The material layer 802 has openings 850 that expose portions 822 of the substrate 702. The openings 850 described herein may include trenches, vias, holes, apertures and the like. In one embodiment, the material layer 802 may be dielectric material such as a silicon containing material, a carbon containing material, or other suitable materials. Suitable silicon containing materials include silicon, silicon oxide, silicon nitride, silicon oxynitride, and combinations thereof. Suitable carbon containing materials include silicon carbide, silicon oxycarbide, amorphous carbon or the like. In an exemplary embodiment depicted herein, the material layer 802 is a SiOC layer.

At operation 604, the substrate 702 is then transferred to the processing chamber into the processing chamber, such as the pre-cleaning chamber 100 as depicted in FIG. 1, which may be incorporated into the cluster processing system 500 depicted in FIG. 5, to perform a pre-cleaning process on the substrate 702. It is noted that the pre-cleaning process at operation 604 is optional based on the substrate surface conditions. In some embodiments, the pre-cleaning process performed at operation 604 may assist removing surface contaminations or surface native oxide from the substrate surface. In some embodiment, the pre-cleaning process may not be necessary.

In one example, the pre-cleaning process may be performed by supplying a pre-cleaning gas mixture including a hydrogen containing gas with or without an inert gas, such as Ar or He gas. In one example, the hydrogen containing gas may be supplied the hydrogen containing gas in the pre-cleaning gas mixture, an inert gas may also be optionally supplied during the pre-cleaning process. Suitable examples of the hydrogen containing gas include $H_2$, $H_2O$, $H_2O_2$, $NH_3$ and the like. Suitable examples of the inert gas may also be supplied into the pre-cleaning gas mixture as needed. Examples of the inert gas supplied in the gas mixture include Ar, He, Ne, Kr, Xe and the like. In one particular example, the pre-cleaning gas mixture includes $H_2$.

While supplying the pre-cleaning gas mixture, the substrate support temperature may be controlled to maintain the substrate at a temperature greater than 250 degrees Celsius, such as greater than 300 degrees Celsius, for example between 300 degrees Celsius and about 600 degrees Celsius, such as 400 degrees Celsius. It is believed that the relatively higher substrate temperature control during the pre-cleaning process may assist removing surface contamination and/or substrate surface native oxide from the substrate surface. The pre-cleaning gas mixture is supplied through the chamber plasma region 121 into the substrate processing region 141 to form a remote plasma source in the chamber plasma region 121 from the pre-cleaning gas mixture for removing surface contaminants and native oxide. The amount of gases introduced into the processing chamber 100 from the pre-cleaning gas mixture may be varied and adjusted to accommodate, for example, the thickness of the native oxide or the amount of the surface contaminates to be removed.

A remote plasma power from the power source 152 is provided to form a plasma in the chamber plasma region 121 from the pre-cleaning gas mixture supplied at operation 604. The plasma generated remotely in the chamber plasma region 121 during the pre-cleaning process at operation 604 may have the etchants dissociated to form a relatively mild and gentle etchants, so as to slowly, gently and gradually etch the surface contaminants and native oxide, e.g., an isotropic etching process. The remote plasma process provides good control for the interface cleaning and promotes high etching selectivity.

At operation 606, a first deposition process is performed to form a barrier layer 704 (e.g., a liner layer) on the substrate 702, as shown in FIG. 7A. The deposition process may be an atomic layer deposition (ALD) process performed at the ALD processing chamber 200 depicted in FIG. 2, or a chemical vapor deposition (CVD) process performed at the CVD processing chamber 300 depicted in FIG. 3, or other suitable processing chambers incorporated in the cluster processing system 500, such as a PVD Endura® system. In one embodiment, the barrier layer 704 is formed to prevent metal diffusion from the conductive layers later formed thereon to the nearby surrounding dielectric layer, such as the material layer 802. Thus, the barrier layer 704 is selected to have good barrier properties to block ion diffusion therethrough during the subsequent thermal cycles and processes. In another embodiment, the barrier layer 704 is formed to facilitate the nucleation of metal elements subsequently formed on the material layer 802. Thus, the barrier layer 704 can be considered as a liner. In one embodiment, the barrier layer and/or liner layer 704 is fabricated by a metal containing layer, such as Ta containing layer, Ti containing layer, Co containing materials, Ru containing materials, Mn containing materials and the like. In the embodiment depicted herein, the barrier layer 704 is a TaN, TiN, TaON, TiON, Ti alloy or Ta alloy.

In one embodiment, the first deposition process may be performed by supplying a deposition gas mixture including a metal containing precursor into the processing chamber 200. Suitable examples of the metal containing precursor include Ta containing gas or Ti containing gas and the like. Some reacting gases may also be supplied in the deposition gas mixture. Suitable examples of the reacting gases include $N_2$, $NH_3$, $O_2$, $N_2O$, $NO_2$ and the like. Other purge gas, and/or dilution gas, such as Ar, He, $N_2$, $N_2O$, $NO_2$, $NH_3$ may also be supplied with the deposition gas mixture as needed.

In one embodiment, the barrier layer 704 is a TaN, TiN, TaO, TiO, TaON or TiON layer.

At an optional operation 607, a plasma treatment process may be performed to treat the barrier layer 704 (or a liner layer). It is believed that the plasma treatment process reduces surface roughness of the deposited barrier 704 by reducing impurities and densifying the barrier layer 704. Exemplary plasma forming gases for the plasma treatment process of operation 607 include hydrogen ($H_2$), nitrogen ($N_2$), ammonia ($NH_3$), and combinations thereof. During the plasma treatment process, several process parameters are also regulated. In one implementation, the process pressure is controlled at between about 0.1 Torr and about 100 Torr (e.g., between about 0.1 Torr and about 80 Torr; between about 1 Torr and about 20 Torr or between about 7 Torr and about 30 Torr). In one implementation, the processing temperature is between about 100 degrees Celsius and about 900 degrees Celsius (e.g., between about 125 degrees Celsius and about 350 degrees Celsius, for example between about 200 degrees Celsius and about 300 degrees Celsius, such as between about 250 degrees Celsius and about 340 degrees Celsius). The RF power may be controlled at between about 100 Watts and about 800 Watts, for example, about 400 Watts. The plasma forming gas, such as $H_2$ gas, may be supplied at between about 3000 sccm and about 5000 sccm, for example, about 4000 sccm. The $H_2$ gas supplied from the substrate edge/substrate bottom may be controlled at between about 200 sccm and about 1000 sccm. The argon gas may be supplied from the substrate edge/substrate bottom at between about 200 sccm and about 1000 sccm.

Figure 7B:
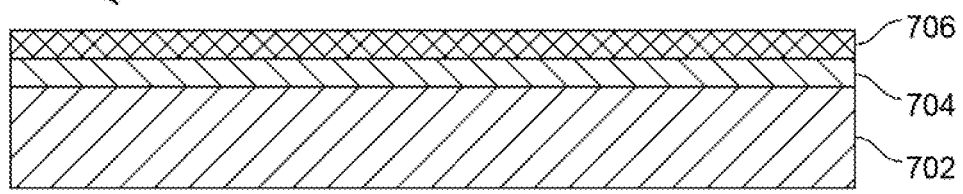

At operation 608, a second deposition process is performed to form an interface layer 706 on the barrier layer 704, as shown in FIG. 7B. The interface layer 706 may also be a metal containing layer formed by a CVD process, a ALD process, or a PVD process. The interface layer 706 provides a good interface adhesion to bridge the gap filling layer 708 (as swhon in FIG. 7C) to the barrier layer 704 so that the interface adhesion may be enhanced and promoted.

In one embodiment, the interface layer 706 may be tungsten containing materials, nickel containing materials, aluminum containing materials, ruthenium containing materials, or manganese containing materials. In one embodiment, the interface layer 706 is a ruthenium containing layer.

In one example, the interface layer 706 has a thickness between about 0.3 nm and about 3 nm and is deposited by a metal organic vapor deposition (MOCVD) process, such as in the CVD processing chamber 300 depicted in FIG. 3.

Figure 7C:
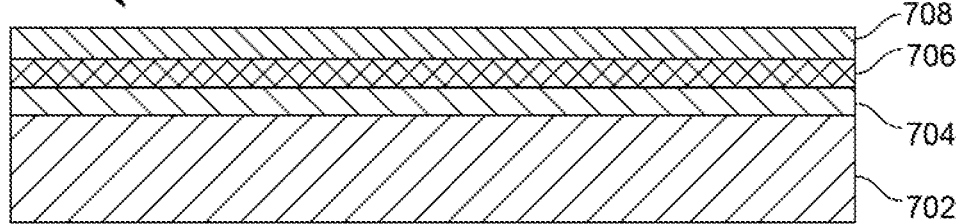

At operation 610, a gap filling deposition process is performed to form a gap filling layer 708, as shown in FIG. 7C. As further shown in the example depicted in FIG. 8, the gap filling layer 708 is formed in the opening 850, filling the space defined in the opening 850 with minimal defects, such as minimal seems or voids. In one example, the gap filling layer 708 is a Co layer or a Co alloy. In one example, the gap filling layer 708 is formed by a cyclical layer deposition (CLD), atomic layer deposition (ALD), chemical vapor deposition (CVD), or the like. In the example depicted herein, the gap filling layer 708 is formed by a CVD process.

The CVD process as performed at operation 610 includes multiple sub-operations (e.g., different processes along the CVD process). For example, the CVD process for forming the gap filling layer 708 at operation 610 may include at least one cycle of a deposition process and a plasma treatment. The number of the cycles may be repeated as many times as needed until a desired thickness of the gap filling layer 708 is achieved. Approximately, each cycle of the deposition process and the plasma treatment process may form a thickness, e.g., a portion, of between about 20 Å and about 200 Å of the gap filling layer 708 on the interface layer 706. In each cycle, the deposition process may be performed for between about 60 seconds and about 600 seconds followed by the plasma treatment process for a period of time between about 10 seconds and about 120 seconds.

In one example, the deposition process may be performed by supplying a deposition precursor gas mixture including a cobalt precursor. The deposition precursor gas mixture may be supplied with a reacting gas mixture, as needed. The reacting gas mixture may be a hydrogen gas ($H_2$) or a $NH_3$ gas as needed. Suitable cobalt precursors may include, but not limited to, cobalt carbonyl complexes, cobalt amidinates compounds, cobaltocene compounds, cobalt dienyl complexes, cobalt nitrosyl complexes, derivatives thereof, complexes thereof, plasmas thereof, or combinations thereof. In one embodiment, examples of the cobalt precursors that may be used herein include dicobalt hexacarbonyl butylacetylene (CCTBA, $(CO)_6Co_2(HC{\equiv}C^tBu)$), dicobalt hexacarbonyl methylbutylacetylene ($(CO)_6Co_2(MeC{\equiv}C^tBu)$), dicobalt hexacarbonyl phenylacetylene ($(CO)_6Co_2(HC{\equiv}CPh)$), hexacarbonyl methylphenylacetylene ($(CO)_6Co_2(MeC{\equiv}CPh)$), dicobalt hexacarbonyl methylacetylene ($(CO)_6Co_2(HC{\equiv}CMe)$), dicobalt hexacarbonyl dimethylacetylene ($(CO)_6Co_2(MeC{\equiv}CMe)$), derivatives thereof, complexes thereof, plasmas thereof, or combinations thereof. Other exemplary cobalt carbonyl complexes include cyclopentadienyl cobalt bis(carbonyl) ($CpCo(CO)_2$), tricarbonyl allyl cobalt ($(CO)_3Co(CH_2CH{=}CH_2)$), derivatives thereof, complexes thereof, plasmas thereof, or combinations thereof. In one particular example of the cobalt precursor used herein is dicobalt hexacarbonyl butylacetylene (CCTBA, $(CO)_6Co_2(HC{\equiv}C^tBu)$).

After the deposition process, a plasma treatment process is performed in the same chamber. The plasma treatment process may assist densifying the portion of the gap filling layer 708 formed on the substrate 702 so as to drive out the defects, such as voids, air and impurities from the gap filling layer 708. The plasma treatment process is performed in the same processing chamber where the gap filling layer deposition is performed, such as the plasma processing chamber 300 depicted in FIG. 3. Similarly, the plasma treatment process may be performed in other suitable plasma processing chamber incorporated in the cluster system 500 depicted in FIG. 5 where the plasma processing chamber 300 is also incorporated thereto. Alternatively, the plasma treatment process may be performed in other stand-alone processing chamber not incorporated in the cluster system 500 where the plasma processing chamber 300 is incorporated. In one example, the plasma treatment process is performed globally and universally to remove loose bonding structures, voids or air from the gap filling layer 708 formed across the substrate 306.

In one embodiment, the plasma treatment process is performed in the chamber 300 where the gap filling layer 708 is formed. The plasma treatment process utilizes a RF source or bias power applied either to the showerhead assembly or substrate support assembly or both to generate the plasma. The RF source power, bias power or remote plasma source is applied to generate the plasma in the presence of the treatment gas mixture.

In one example, the treatment gas mixture may include at least a hydrogen containing gas, such as $H_2$, $NH_3$ and the like. In some examples, an inert gas, such as Ar or He, may also be supplied in the treatment gas mixture. In one embodiment, the hydrogen containing gas is $H_2$ at a volumetric flow rate of between about 1000 sccm and about 6000 sccm. In one embodiment, the inert or carrier gas is Ar or He at a volumetric flow rate of between about 3000 sccm and about 5000 sccm.

During the plasma treatment process, several process parameters may be regulated to control the plasma treatment process. In one exemplary embodiment, a process pressure in the processing chamber 100 is regulated to between about 10 mTorr to about 5000 mTorr, such as between about 300 mTorr and about 3000 mTorr. A substrate temperature may be maintained at a range of between about 80 degrees Celsius and about 400 degrees Celsius, such as between about 150 degrees Celsius and about 250 degrees Celsius. The plasma treatment process may be performed for between about 5 seconds and about 600 seconds, such as between about 20 seconds and about 120 seconds.

After the plasma treatment process, a cycle of the deposition process and the plasma treatment process is completed. Each cycle of the deposition process and the plasma treatment process may form a portion of the gap filling layer 708 with a thickness of between about 20 Å and about 200 Å.

The number of the cycles (e.g., alternating processes between the deposition process and the plasma treatment process) utilized to form the gap filling layer 708 may be as many as needed. In the example depicted in FIG. 7C, the cycles of the deposition process and the plasma treatment process may be performed for between about 2 and about 15 times to obtain a total thickness of the gap filling layer 708 in a range between about 10 nm and about 40 nm.

Figure 7D:
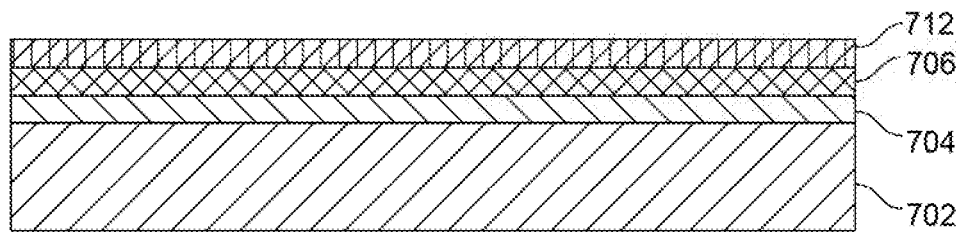

At operation 612, a post annealing process is performed. The post annealing process is an annealing process performed at high process pressure, such as greater than 5 bar, such as greater 5 bar but less than 70 bar. The high pressure annealing process may assist repairing the vacancies and deposition byproduct and/or residuals and smoothening surface roughness of the gap filling layer 708, forming an annealed gap filling layer 712, as shown in FIG. 7D. In some examples, the high process pressure may go up to 70 bar. The high pressure annealing process may be performed at a processing chamber, such as the processing chamber 400 depicted in FIG. 4, or other suitable processing chambers, including those that process substrate one at a time.

The high pressure annealing process performed at operation 612 maintains processing pressure at the high-pressure region in a vapor phase, for example in a dry vapor phase that has substantially no liquid droplets present. For example, in a superheated state. The processing pressure and temperature is controlled to densify the film structures, so as to repair the film defects, driving out impurities and smoothing surface roughness. In one example, the internal volume 415 (as shown in FIG. 4) is pressurized to a pressure greater than atmosphere, for example greater than about 2 bar. In another example, the internal volume 415 is pressurized to a pressure from about 5 to about 70 bars, such as from about 5 to about 50 bars, such as between about 25 bar and about 55 bar.

During processing, the internal volume 415 is maintained at a relatively low temperature, for example, a temperature greater than 250 degrees Celsius, such as between about 300 degrees Celsius and about 500 degrees Celsius, by the heaters 440.

It is believed that the high pressure process may provide a driving force to drive out impurities and connect the dangling bonds in the gap filling layer 708, thus, reducing the likelihood of forming defects, such as voids, increasing the film qualities and smoothening the surface roughness. In one example, a hydrogen containing gas, a hydrogen gas, and/or hydrogen isotope containing gas, such as $H_2$, $D_2$, $T_2$, $H_2O$, $H_2O_2$, $NH_3$, and dry steam, may be supplied during the annealing process. An inert gas, such as He and Ar, may also be supplied during the annealing process. In one example, during the annealing process, a hydrogen gas ($H_2$) is supplied during the annealing process. In another example, during the annealing process, a hydrogen gas ($H_2$) or hydrogen isotope containing gas is supplied during the annealing process.

In one exemplary implementation, a process pressure is regulated at a pressure greater than 2 bar, such as greater than 5 bar, for example between 5 bar and 70 bar, such as between 20 bar and about 50 bar. The process temperature may be controlled at greater than 250 degrees Celsius, such as between about 250 degrees Celsius and about 700 degrees Celsius, such as between about 300 degrees Celsius and about 500 degrees Celsius.

After the annealing process at high pressure, the gap filling layer 708 has an enhanced film structure with high purity, large grain structure, less grain boundaries with smooth surface roughness, which provides a relatively robust film structure that provides higher film density and low film resistivity is obtained. In the example wherein the gap filling layer 708 is Co containing material, the film resistivity for the Co containing material may be reduced between about 10% and about 50% after the high pressure annealing process. The gap filling layer 708 formed in the opening 850 may be substantially void free with high gap filling capability. The gap filling layer 708 has an average grain size between about 80 Å and about 400 Å.

Thus, a method and an apparatus for forming a gap filling layer, such as a metal containing material, for a device structure, such as a channel structure, interconnection structure or a contact structure, are provided. The interconnection structure may include a barrier layer, an interface layer and the gap filling layer in one cluster processing system without breaking vacuum so as to eliminate the likelihood of surface contamination and provide a good interface control. An annealing process improves the film quality of the interconnection structure so that the device structure containing the interconnection structure may achieve desired electrical performance, wherein the annealing process is performed at a pressure range greater than 5 bar in hydrogen or hydrogen isotope containing ambient.

While the foregoing is directed to embodiments of the present disclosure, other and further embodiments of the disclosure can be devised without departing from the basic scope thereof, and the scope thereof is determined by the claims that follow.

What is claimed is:

1. A method for forming a device structure for semiconductor device, comprising:
   forming a barrier layer in an opening formed in a material layer disposed on a substrate, wherein a width of the opening is less than 20 nm;
   performing a first plasma treatment process on the barrier layer;
   forming an interface layer on the barrier layer after performing the first plasma treatment process, wherein a thickness of the interface layer is in a range of about 0.3 nm to about 3 nm;
   forming a gap filling layer on the interface layer; and
   performing an annealing process on the substrate, wherein the annealing process is performed at a pressure range greater than 5 bar.

2. The method of claim 1, wherein the gap filling layer is a Co layer or a Co alloy.

3. The method of claim 1, wherein performing the annealing process further comprises:
   maintaining a substrate temperature greater than 250 degrees Celsius.

4. The method of claim 1, wherein the barrier layer is a Ta containing layer or a Ti containing layer.

5. The method of claim 1, wherein the barrier layer, the interface layer and the gap filling layer are formed in a cluster system without breaking vacuum.

6. The method of claim 1, wherein performing the annealing process further comprises:
   increasing grain sizes of the gap filling layer.

7. The method of claim 1, wherein the interface layer is a metal containing layer.

8. The method of claim 7, wherein the interface layer is at least one of a tungsten containing material, nickel containing material, aluminum containing material, ruthenium containing material, or manganese containing material.

9. The method of claim 1, further comprising:
   performing a pre-cleaning process prior to forming the barrier layer.

10. The method of claim 9, wherein performing the pre-cleaning process further comprises:
    maintaining a substrate temperature greater than 250 degrees Celsius.

11. The method of claim 1, wherein forming the gap filling layer further comprises:
    (a) performing a deposition process to form a portion of the gap filling layer; and
    (b) performing a second plasma treatment process on the portion of the gap filling layer.

12. The method of claim 11, further comprising:
    repeating (a) and (b).

13. The method of claim 11, wherein the second plasma treatment process further comprises:
    supplying a treatment gas mixture comprising hydrogen containing gas.

14. The method of claim 11, wherein the deposition process is a CVD process.

15. A method for forming an interconnection structure, comprising:
    forming a barrier layer in an opening formed in a material layer disposed on a substrate;
    performing a first plasma treatment process on the barrier layer;
    performing a gap filling layer formation process over the barrier layer by repeatedly performing a deposition process and a second plasma treatment process until a predetermined thickness of a gap filling layer is obtained; and
    performing an annealing process on the gap filling layer at a pressure greater than 5 bar while supplying hydrogen or hydrogen isotope containing gas, wherein the annealing process is performed after completion of the gap filling layer formation process and after the gap fill layer fills the opening.

16. The method of claim 15, wherein the gap filling layer is formed on an interface layer, wherein the gap filling layer and the interface layer are formed in the opening, and wherein a width of the opening is less than 20 nm and a thickness of the interface layer is in a range of about 0.3 nm to 3 nm.

17. An interconnection structure, comprising:
    a barrier layer formed in an opening defined in a material layer disposed on a substrate, wherein the barrier layer is densified by a plasma treatment, and wherein a width of the opening is less than 20 nm;
    an interface layer disposed on the barrier layer within the opening, wherein a thickness of the interface layer is in a range of about 0.3 nm to about 3 nm; and
    a gap filling layer disposed on the interface layer, wherein the gap filling layer has an average grain size greater than 10 nm.

18. The interconnection structure of claim 17, wherein the gap filling layer is a Co layer or Co alloy.

19. The interconnection structure of claim 17, wherein the interface layer is a Ru containing layer and the barrier layer is a Ta containing layer or a Ti containing layer.

* * * * *